United States Patent
Malinowski et al.

(10) Patent No.: US 11,424,349 B1
(45) Date of Patent: Aug. 23, 2022

(54) EXTENDED SHALLOW TRENCH ISOLATION FOR ULTRA-LOW LEAKAGE IN FIN-TYPE LATERAL BIPOLAR JUNCTION TRANSISTOR DEVICES

(71) Applicant: GLOBALFOUNDRIES U.S. Inc., Santa Clara, CA (US)

(72) Inventors: Arkadiusz Malinowski, Dresden (DE); Alexander M. Derrickson, Saratoga Springs, NY (US); Judson R. Holt, Ballston Lake, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 17/177,490

(22) Filed: Feb. 17, 2021

(51) Int. Cl.
| | | |
|---|---|---|
| *H01L 29/735* | (2006.01) | |
| *H01L 29/66* | (2006.01) | |
| *H01L 29/06* | (2006.01) | |

(52) U.S. Cl.
CPC ........ *H01L 29/735* (2013.01); *H01L 29/0649* (2013.01); *H01L 29/6625* (2013.01)

(58) Field of Classification Search
CPC H01L 29/735; H01L 29/0649; H01L 29/6625
See application file for complete search history.

(56) References Cited

U.S. PATENT DOCUMENTS

| | | |
|---|---|---|
| 5,102,812 A | 4/1992 | Caneau et al. |
| 7,897,995 B2 | 3/2011 | Yang et al. |
| 8,310,027 B2 | 11/2012 | Russ et al. |
| 8,759,943 B2 | 6/2014 | Tseng et al. |
| 9,209,202 B2 | 12/2015 | Ponoth et al. |
| 9,219,068 B2 | 12/2015 | Cheng et al. |
| 9,263,583 B2 | 2/2016 | Cai et al. |
| 9,608,059 B2 | 3/2017 | Cappellani et al. |
| 9,786,765 B2 | 10/2017 | Nowak et al. |
| 9,842,897 B2 | 12/2017 | Akarvardar et al. |
| 10,312,327 B2 | 6/2019 | Chang et al. |
| 2003/0025125 A1* | 2/2003 | Menut ................ H01L 29/0649 257/E29.046 |
| 2009/0045467 A1 | 2/2009 | Kakoschke et al. |
| 2018/0158957 A1 | 6/2018 | Rachmady et al. |

FOREIGN PATENT DOCUMENTS

EP 0642170 B1 12/1997

OTHER PUBLICATIONS

Non Final Office Action dated Mar. 23, 2022 for U.S. Appl. No. 17/130,121, filed Dec. 22, 2020; pp. 14.
Notice of Allowance and Fee(s) Due dated May 18, 2022 for U.S. Appl. No. 17/130,121, filed Dec. 22, 2020.

* cited by examiner

*Primary Examiner* — Syed I Gheyas
(74) *Attorney, Agent, or Firm* — Francois Pagette; Hoffman Warnick LLC

(57) ABSTRACT

A lateral bipolar junction transistor (BJT) device includes: an emitter region, a collector region, and a base region, the base region positioned between and laterally separating the emitter region and the collector region, the base region including an intrinsic base region; and a cavity formed in a semiconductor substrate and filled with an insulating material, the cavity physically separating a lower surface of the intrinsic base region from the semiconductor substrate.

16 Claims, 16 Drawing Sheets

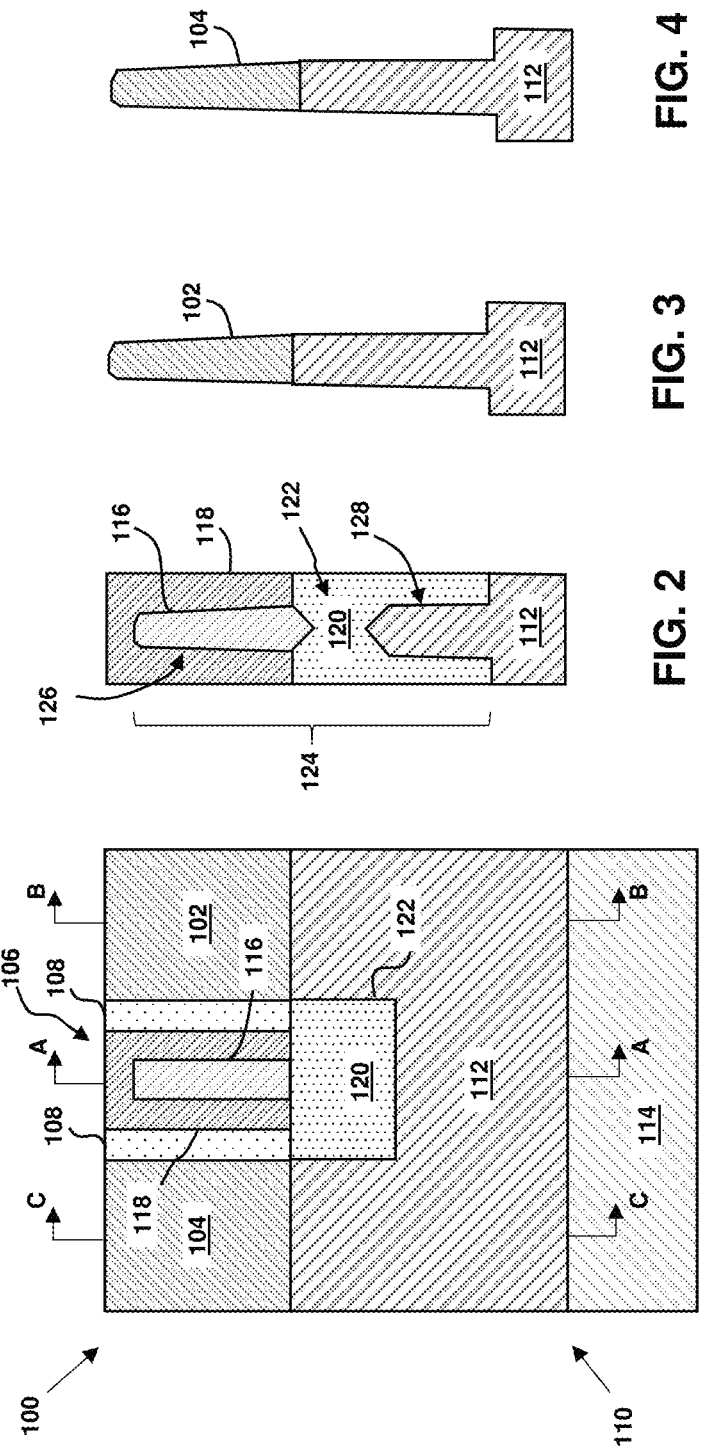

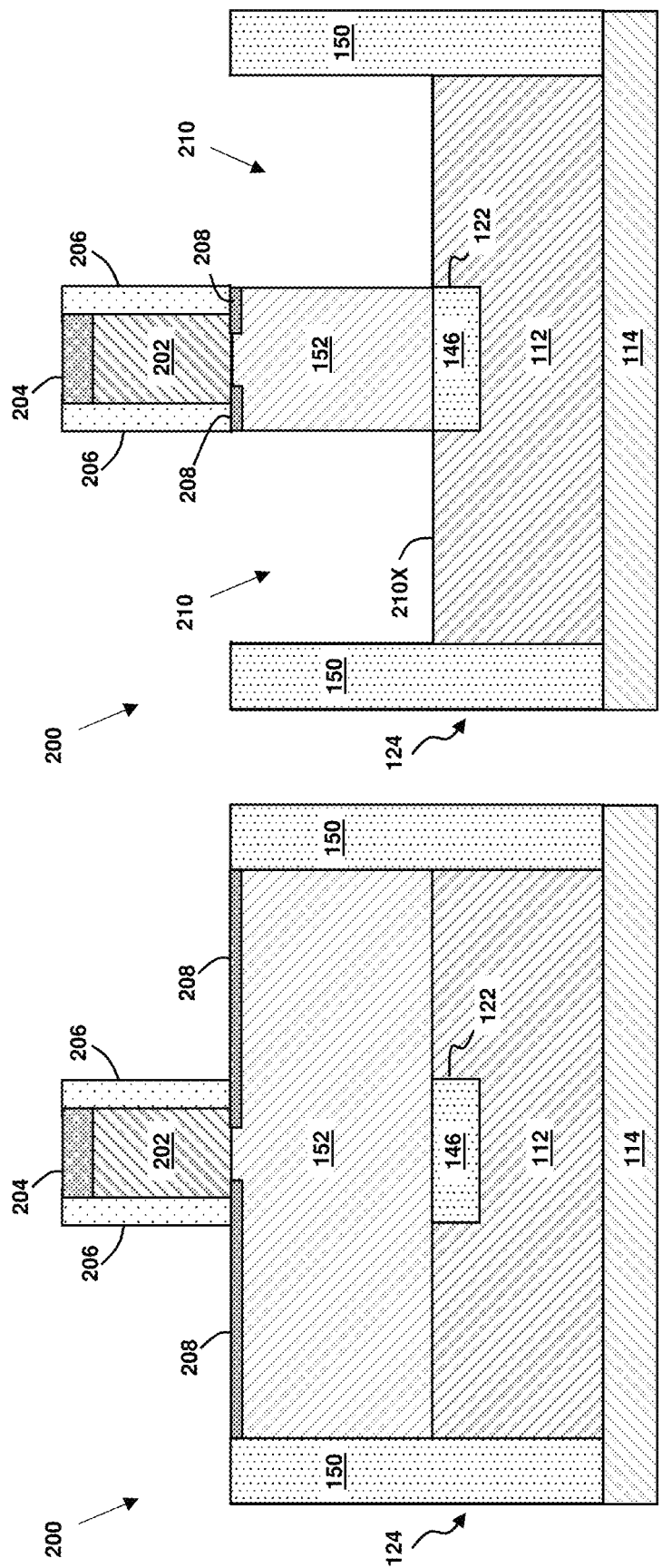

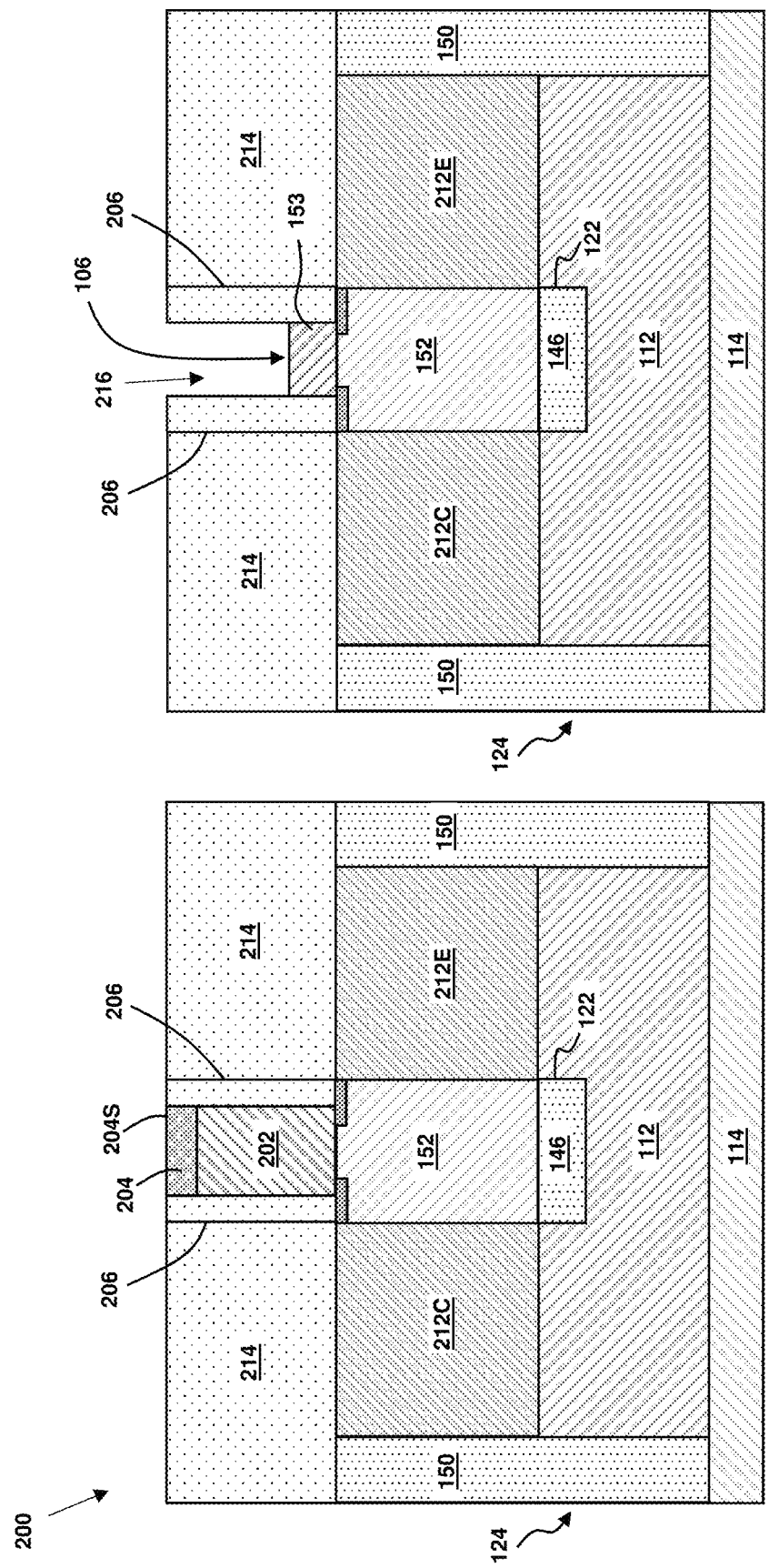

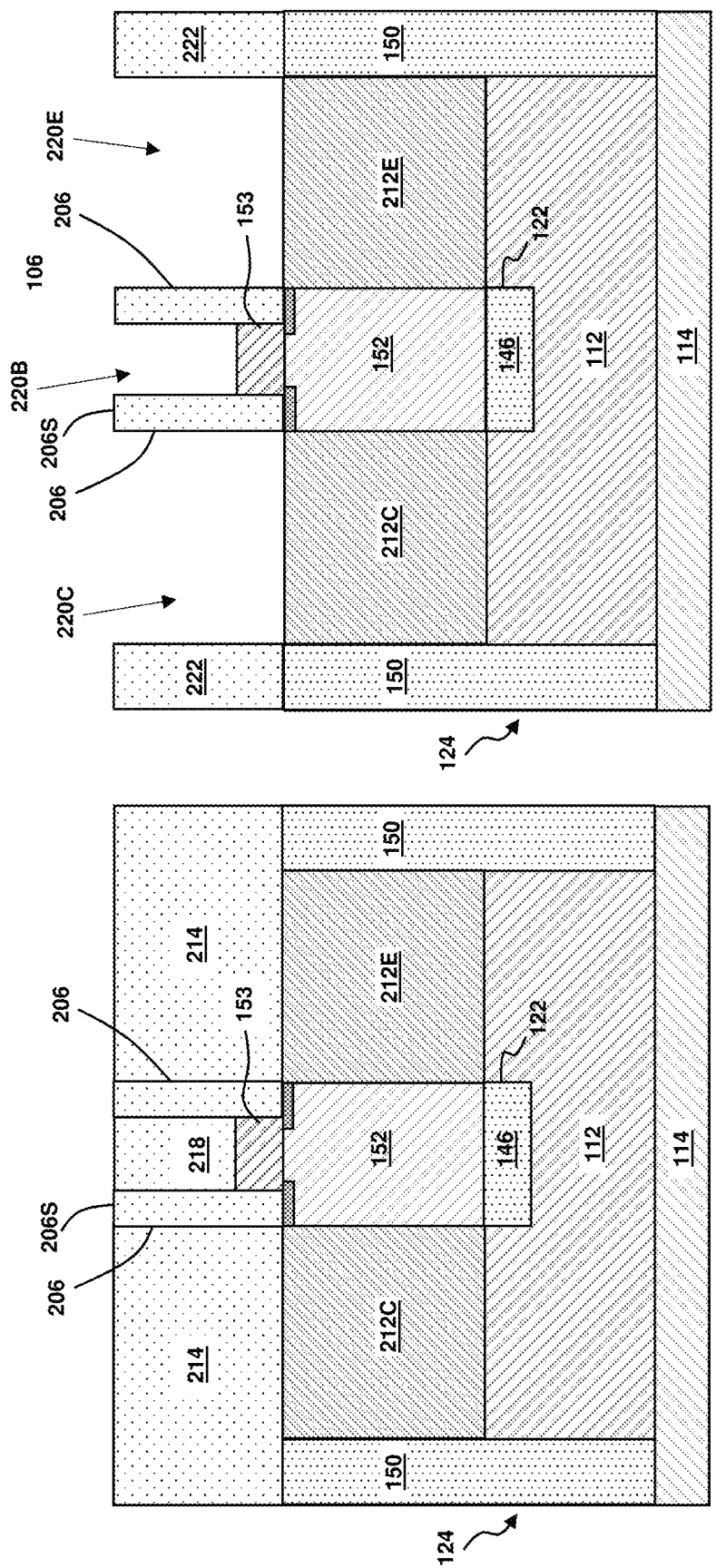

EXTENDED SHALLOW TRENCH ISOLATION FOR ULTRA-LOW LEAKAGE IN FIN-TYPE LATERAL BIPOLAR JUNCTION TRANSISTOR DEVICES

FIELD OF THE DISCLOSURE

Generally, the present disclosure relates to various embodiments of a fin-type lateral bipolar junction transistor (BJT) device and various methods of making such a lateral BJT device.

BACKGROUND

Bipolar junction transistor (BJT) devices are widely used in many integrated circuit products. In general, a BJT device comprises a collector region, a base region, and an emitter region. The BJT device may be either an PNP device or an NPN device. In a PNP BJT device, current flows from the emitter to the base and exits the BJT device via the collector. In an NPN BJT device, current flows from the collector to the base and exits the BJT device via the emitter.

Device designers are under constant pressure to increase the operating speed and performance of BJT devices and integrated circuit products that employ such BJT devices. This may include, for example, reducing the leakage current, power consumption, and thermal dissipation of a BJT device (e.g., due to a high base-bulk leakage current in the BJT).

A system-on-a-chip (SoC) is an integrated circuit product that includes all of the components needed for a system, e.g., a computer. Such an SOC chip may include one or more central processors and co-processors, graphics drivers, memory, power management circuits, wireless communication interfaces, and other parts of a fully functional system. Further, because the signals among the various components on the SoC are kept on-die, power requirements of the system on the SoC can be reduced. SoC devices may be formed using BiCMOS technology, which involves the formation of both BJT devices and CMOS field effect transistors (N-type and P-type) on a single chip. Techniques are needed to effectively and efficiently form BJT devices and CMOS transistors in BiCMOS technology applications.

SUMMARY

The following presents a simplified summary of at least one disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

The present disclosure is generally directed to various embodiments of a fin-type lateral bipolar junction transistor (BJT) device and various methods of forming such a lateral BJT device.

A device according to embodiments includes: an emitter region, a collector region, and a base region, the base region positioned between and laterally separating the emitter region and the collector region, the base region including an intrinsic base region; and a cavity formed in a semiconductor substrate and filled with an insulating material, the cavity physically separating a lower surface of the intrinsic base region from the semiconductor substrate.

A lateral bipolar junction transistor (BJT) device according to embodiments includes: an emitter region, a collector region, and a base region, the base region positioned between and laterally separating the emitter region and the collector region, the base region including an intrinsic base region; and a cavity formed in a semiconductor substrate and filled with an insulating material, the cavity physically separating a lower surface of the intrinsic base region from the semiconductor substrate, wherein the intrinsic base region physically contacts the cavity, and wherein a bottom surface of the emitter region and a bottom surface of the collector region are positioned on an upper surface of the semiconductor substrate.

A method for forming a lateral bipolar junction transistor (BJT) device according to embodiments includes: forming a cavity in a semiconductor substrate; filling the cavity with an insulating material; and forming an emitter region, a collector region, and a base region in the semiconductor substrate, the base region positioned between and laterally separating the emitter region and the collector region, the forming further including forming the base region over and in physical contact with the cavity, wherein the base region is physically separated from the semiconductor substrate by the cavity.

BRIEF DESCRIPTION OF THE DRAWINGS

The disclosure may be understood by reference to the following description taken in conjunction with the accompanying drawings, in which like reference numerals identify like elements, and in which:

FIGS. 1-41 depict various embodiments of a fin-type lateral bipolar junction transistor (BJT) device and various methods of forming such a lateral BJT device according to embodiments of the disclosure.

Figure 5:
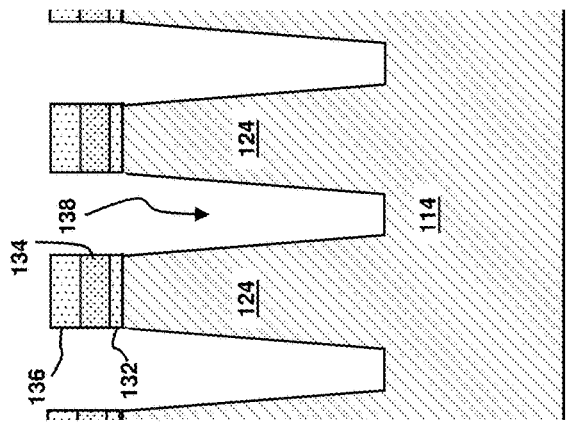

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. The drawings may not be to scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, masking, etching, etc. The thicknesses of these various layers of material may also vary depending upon the particular application.

FIG. 1 is a cross-sectional view of a fin-type lateral bipolar junction transistor (BJT) device 100 according to embodiments of the disclosure. FIG. 2 is a cross-sectional view of the lateral BJT device 100 taken along line A-A in FIG. 1. FIGS. 3 and 4 are cross-sectional views of the lateral BJT device 100 taken along lines B-B and C-C, respectively, in FIG. 1.

The lateral BJT device 100 disclosed herein may be either an NPN device or a PNP device. In the embodiments described herein, the lateral BJT device 100 will be described as an NPN device. Moreover, in the embodiments described herein, the lateral BJT device 100 may be formed in/on a fin structure. However, the presently disclosed subject matter should not be considered to be limited to such fin-based structures.

As depicted in FIGS. 1-4, the lateral BJT device 100 may comprise an $N^+$ doped emitter region 102, an $N^+$ doped collector region 104, and a base region 106 formed laterally between the emitter region 102 and the collector region 104 and separated therefrom by sidewall spacers 108 (e.g., formed of an oxide). The emitter region 102, collector region 104, and base region 106 may be formed above a semiconductor substrate 110. The semiconductor substrate 110 may comprise a P-well (PW) region 112 formed above an N doped bulk semiconductor region 114. In some applications, the semiconductor substrate 110 may be formed of silicon or semiconductor materials other than silicon. Thus, the terms "substrate" or "semiconductor substrate" should be understood to cover all semiconductor materials and all forms of such materials.

The base region 106 of the lateral BJT device 100 may comprise a $P^-$ doped intrinsic base region 116 capped with a $P^+$ doped extrinsic base region 118. A first region of insulating material 120, e.g., silicon dioxide, may be provided under the base region 106 in a shallow trench isolation (STI) cavity 122 formed in the PW region 112 of the semiconductor substrate 110, where the STI cavity 122 physically and electrically separates the base region 106 from the PW region 112 of the semiconductor substrate 110. As shown in FIG. 1, according to embodiments, the STI cavity 122 does not extend under the emitter region 102 and the collector region 104 of the lateral BJT device 100. In other embodiments, the STI cavity 122 may extend partially under the emitter region 102 and the collector region 104 of the lateral BJT device 100.

As described in greater detail below, a fin 124 may be formed in the PW region 112 of the semiconductor substrate 110. As depicted in FIG. 2, the intrinsic base region 116 may be formed in an upper section 126 of the fin 124, where the upper section 126 of the fin 124 is separated from a lower section 128 of the fin 124 by the STI cavity 122.

A process for forming a lateral BJT device 100 according to an embodiment will now be described.

Figure 6:
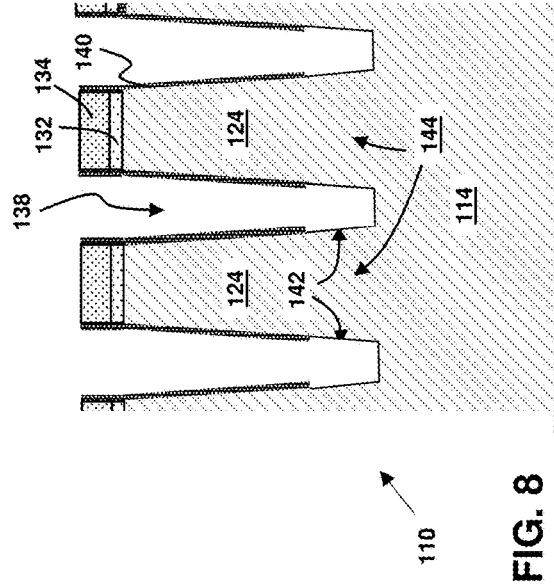

FIGS. 5 and 6 depict the formation of a plurality of fins 124 in the N doped region 114 of a semiconductor substrate 110. For example, as shown in FIG. 5, conformal layers of a first oxide 132, a nitride 134 (e.g., silicon nitride), and a second oxide 136 may be formed on an upper surface 114S of the N doped region 114 of the semiconductor substrate 110. The first and second oxide layers 132, 136 may be formed using any suitable oxide material (e.g., silicon dioxide).

FIG. 6 depicts the structure of FIG. 5 after one or more etching processes have been performed, e.g., anisotropic etching processes, through a patterned fin-formation etch mask (not shown) to form a plurality of trenches 138 in the N doped region 114 of the semiconductor substrate 110 and thereby define the fins 124. The width and height of the fins 124 may vary depending upon the particular application. Additionally, the overall size, shape, and configuration of the trenches 138 and fins 124 may vary depending on the particular application. In the examples depicted herein, the fins 124 are depicted as having a tapered cross-sectional configuration, wherein the width of the upper surface of the fin 124 is less than the width of the bottom of the fins 124. Additionally, the axial length of the fins 124 may also vary depending upon the particular application. Of course, the physical dimensions of the fins 124 may change depending upon the particular application and upon advances in technology.

Figure 7:
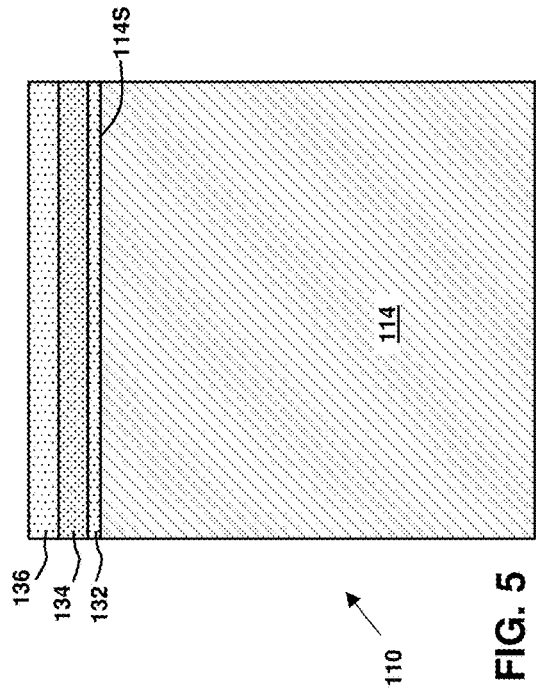

Next, referring to FIG. 7, a deposition process (e.g. atomic layer deposition (ALD) process) may be performed to deposit a conformal oxide liner 140 on the exposed surfaces of the structure depicted in FIG. 6. The oxide liner 140 may be formed of silicon dioxide or other suitable material. Then, as depicted in FIG. 8, one or more masking/lithography and oxide etching processes may be performed to selectively remove the second oxide layer 136 and the oxide liner 140 formed thereon, and to selectively remove the oxide liner 140 from a lower portion 142 of each of the trenches 138.

Figure 8:
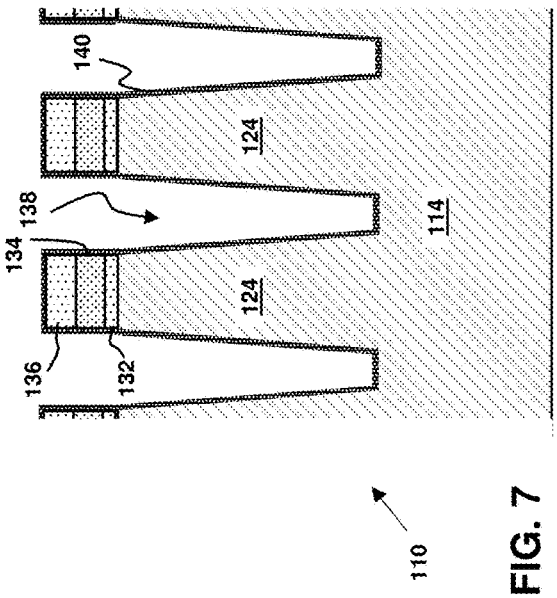
Figure 9:
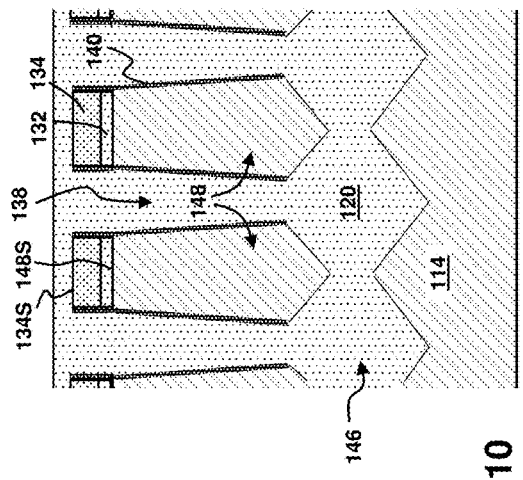
Figure 10:
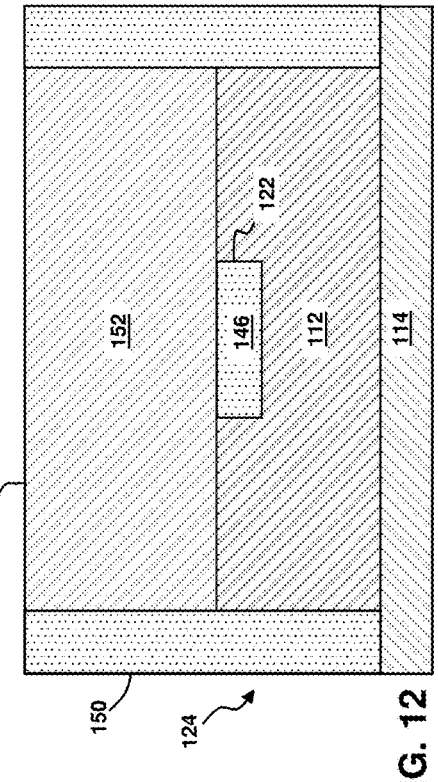

Referring now to FIG. 9, one or more etching processes (e.g., using an etchant such as TMAH (tetramethylammoniumhydroxide)) may then be performed on the structure of FIG. 8 to selectively remove a lower portion 144 (FIG. 8) of each of the fins 124 to form a plurality of STI cavities 146 in the N doped region 114 of the semiconductor substrate 110. Comparing FIG. 9 to FIG. 2, it can be seen that the STI cavity 146 corresponds to the STI cavity 122, while the remaining upper portion 148 of the fin 124 corresponds to the intrinsic base region 116 of the lateral BJT device 100. This etching process removes the N doped region 114 of the semiconductor substrate 110 at the lower portion 144 (FIG. 8) of each of the fins, but has no effect on the nitride layer 134 or the oxide liner 140. After etching, as depicted in FIG. 10, the trenches 138 and STI cavities 146 may be filled with an insulating material 120, e.g., silicon dioxide. This may be achieved, for example, using flowable chemical vapor deposition (FCVD) and/or other processing techniques.

It should be noted by comparing FIGS. 2 and 9 that the cavity STI 146 in FIG. 9 and the cavity 122 in FIG. 2 (as well as the cavity 160 (FIG. 18) and the cavity 184 (FIG. 28)) may be located at different sections of each fin 124. For example, the cavity 122 in FIG. 2 may be located proximate a midpoint of the fin 124, while the STI cavity 146 in FIG. 9 may be located proximate the bottom of the fin 124. In general, according to embodiments, the locations of the cavities disclosed herein (e.g., STI cavities 122, 146, 160, 184) may vary in accordance with application, performance, and/or processing requirements. In addition, the size and configuration of the cavities disclosed herein may vary in accordance with application, performance, and/or processing requirements.

Figure 11:
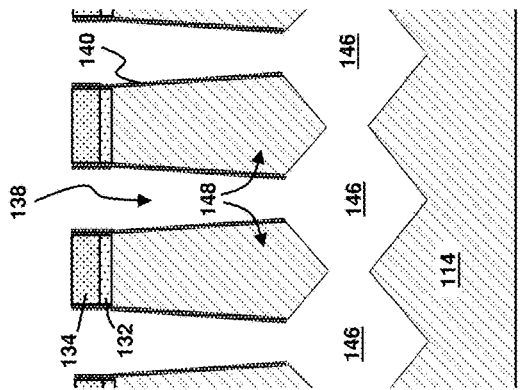

FIG. 11 depicts the structure of FIG. 10 after several additional processing steps have been performed. Such processing steps may include, for example, chemical-mechanical polishing (CMP) of the insulating material 120 down to the top surface 134S of the nitride layer 134 and the removal of the insulating material 120 in a fin reveal process down to the top surface 148S of the upper portion 148 of the fins 124 (e.g., via chemical oxide etch (COE), plasma etch (e.g., RLSA), or other suitable process(es)). One or more etching processes may then be performed to remove the nitride layer 134 and the first oxide layer 132, and to remove a portion of the insulating material 120 and the oxide liner 140 from an upper portion 137 of the trenches 138.

Figure 12:
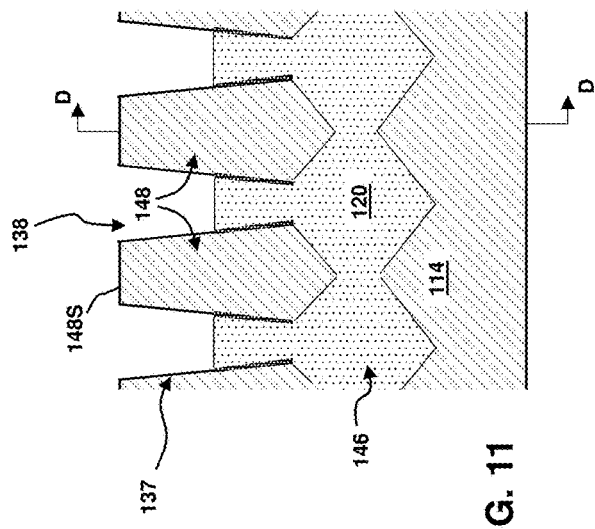

FIG. 12 depicts a cross-sectional view of the structure depicted in FIG. 11 taken along line D-D after several additional processes have been performed. For example, isolation structures 150 may be formed in the fin 124 by performing known manufacturing techniques. The isolation structures 150 may be comprised of any insulating material, e.g., silicon dioxide. Several ion implantation processes may be performed to form a PW region 112 and a P⁻ doped region 152 in the N doped region 114 of the semiconductor substrate 110. According to embodiments, the P⁻ doped region 152 forms the P⁻ doped intrinsic base region 116 (FIG. 1).

A process for forming a lateral BJT device 100 according to another embodiment will now be described.

Figure 14:
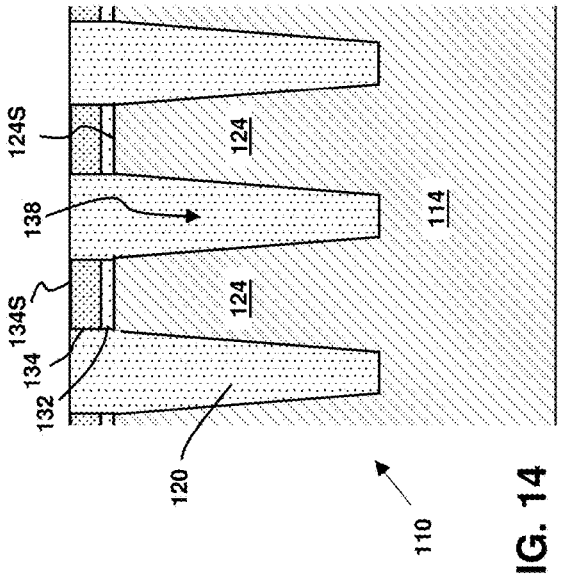
Figure 13:
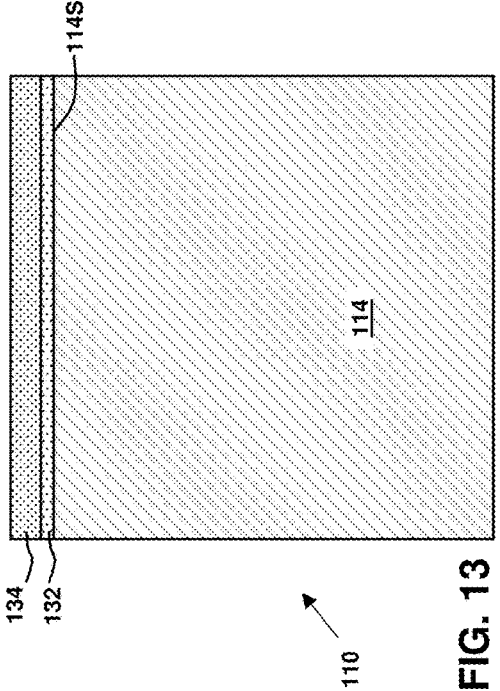
Figure 15:
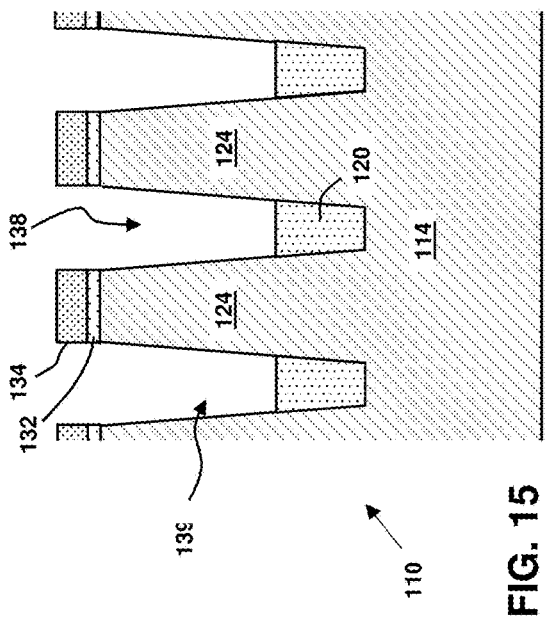

FIGS. 13-15 depict the formation of a plurality of fins 124 in the N doped region 114 of the semiconductor substrate 110. For example, as shown in FIG. 13, an oxide layer 132 (e.g., silicon dioxide) and a nitride layer 134 (e.g., silicon nitride) may be formed on an upper surface 114S of the N doped region 114 of the semiconductor substrate 110.

FIG. 14 depicts the structure of FIG. 13 after a plurality of processes have been performed. For example, one or more etching processes may be performed, e.g., anisotropic etching processes, through a patterned fin-formation etch mask (not shown) to form a plurality of trenches 138 in the N doped region 114 of the semiconductor substrate 110 and thereby define the fins 124. After etching, as also depicted in FIG. 14, the trenches 138 may be filled with an insulating material 120, e.g., silicon dioxide. This may be achieved, for example, using flowable chemical vapor deposition (FCVD) and/or other processing techniques. CMP of the insulating material 120 may then be performed down to the top surface 134S of the nitride layer 134. STI deglazing or other suitable process(es) may then be performed on the structure of FIG. 14 to remove the insulating material 120 down to the top surface 124S of the fins 124 and from within an upper portion 139 of the trenches 138. The resultant structure is depicted in FIG. 15.

Figure 16:
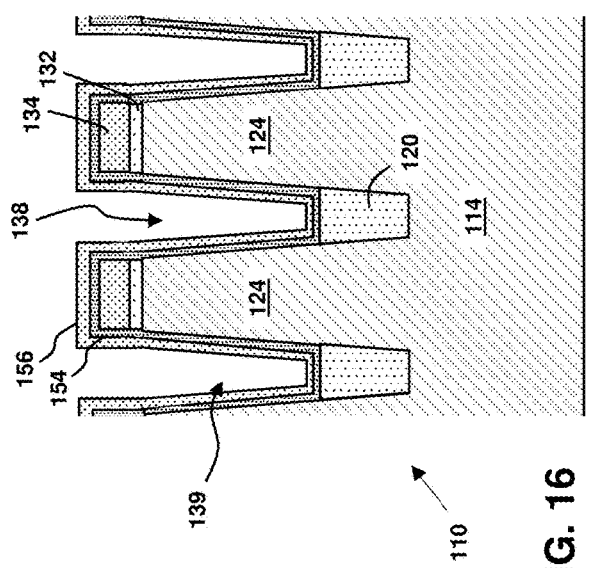

FIG. 16 depicts the structure of FIG. 15 after several deposition processes were performed. A first deposition process may include the formation of a conformal layer of insulating material 154 (e.g., silicon dioxide) on the structure of FIG. 15 and within the upper portion 139 of the trenches 138. A second deposition process may include the formation of a conformal layer of a nitride 156 (e.g., silicon nitride) on the conformal layer of insulating material 154. Then, as depicted in FIG. 17, one or more masking/lithography, nitride etching, and oxide etching processes (e.g., reactive ion etch (RIE)) may be performed on the structure depicted in FIG. 16 to selectively remove portions of the conformal layer of insulating material 154 and the conformal layer of nitride 156 from the upper section 139 of the trenches 138.

Figure 17:
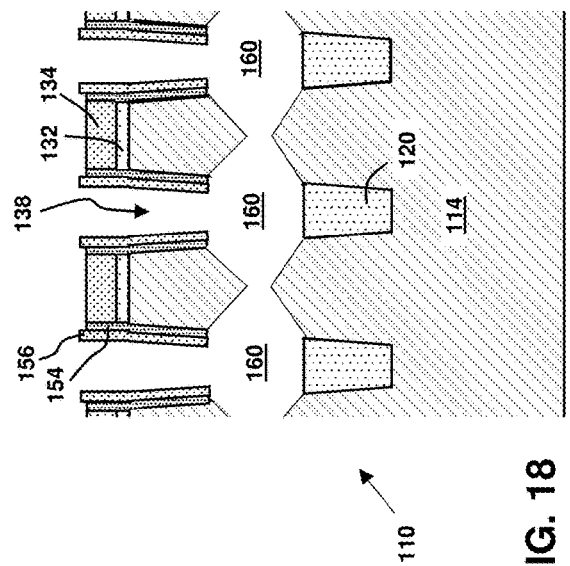
Figure 18:
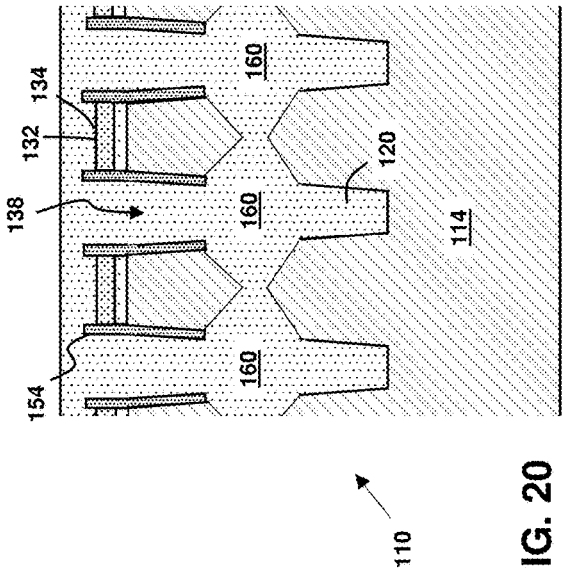

Referring now to FIG. 18, one or more etching processes (e.g., using an etchant such as TMAH) may then be performed on the structure of FIG. 17. The etching processes may be configured to selectively remove a portion 158 (FIG. 17) of each of the fins 124 to form a plurality of cavities 160 in the N doped region 114 of the semiconductor substrate 110. After formation of the cavities 160, an etching process may be performed on the structure of FIG. 18 to selectively remove any remaining portions of the conformal layer of nitride 156. The resultant structure is depicted in FIG. 19.

Figure 19:
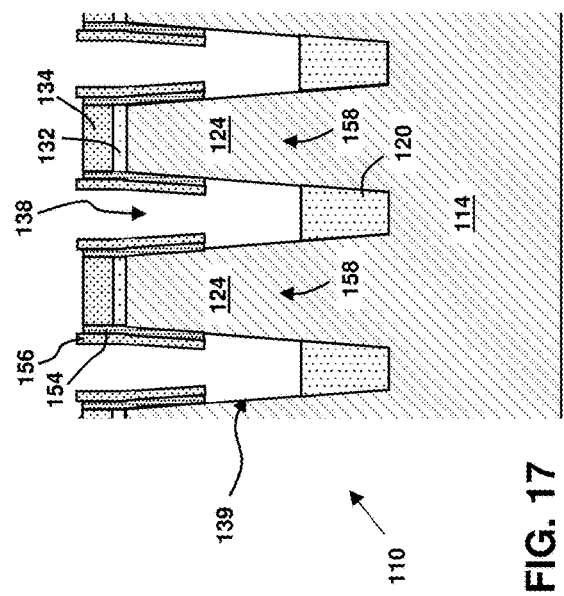
Figure 20:
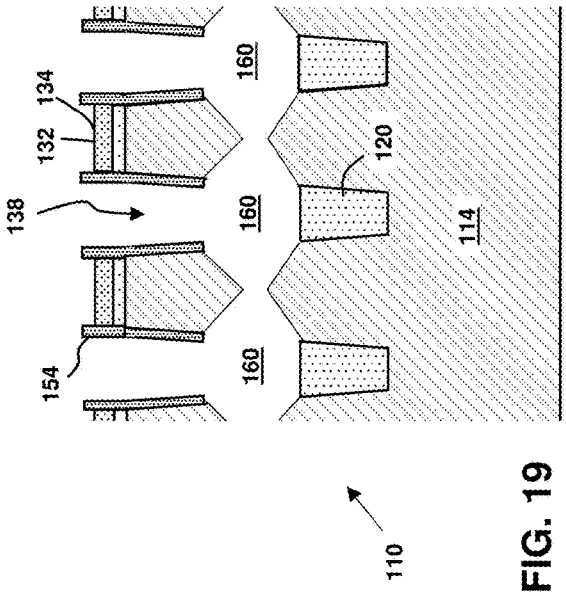

After the nitride etching, as depicted in FIG. 20, the trenches 138 and the cavities 160 of the structure in FIG. 19 may be filled with an insulating material 120, e.g., silicon dioxide. This may be achieved, for example, using flowable chemical vapor deposition (FCVD) and/or other processing techniques.

Figure 21:
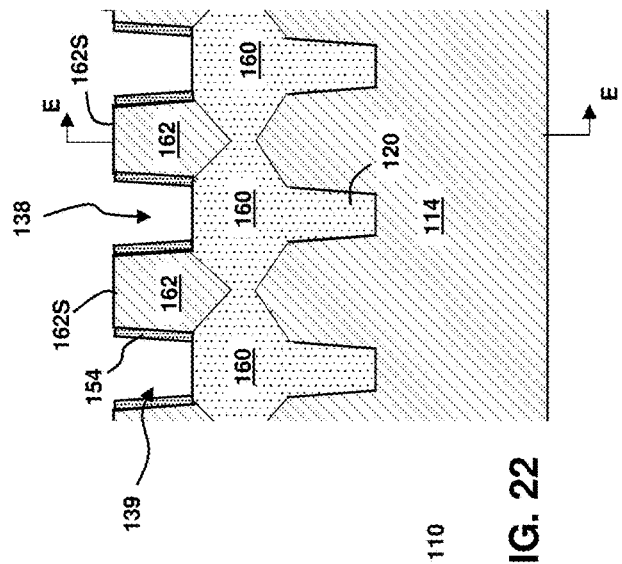
Figure 22:
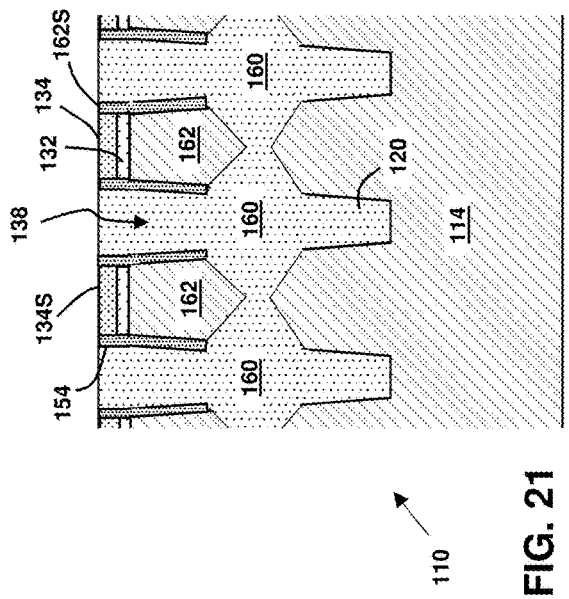

FIG. 21 depicts the structure of FIG. 20 after one or more additional processing steps have been performed. Such processing steps may include, for example, a CMP process to remove the insulating material 120 down to the top surface 134S of the nitride layer 134. Thereafter, as depicted in FIG. 22, a portion of the insulating material 120 may be removed in a fin reveal process (e.g., via chemical oxide etch (COE), plasma etch (e.g., RLSA), or other suitable process (es)) down to a top surface 162S of the upper portion 162 of the fins 124. Etching to remove the nitride layer 134 and the oxide layer 132, and a portion of the insulating material 120 from within the upper portion 139 of the trenches 138 may then be performed.

Figure 23:
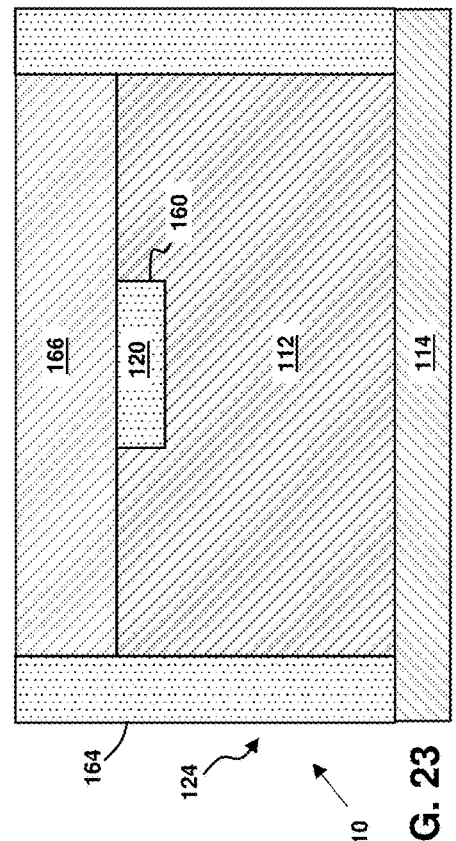

FIG. 23 depicts a cross-sectional view of the structure depicted in FIG. 22 taken along line E-E after several additional processes have been performed. For example, isolation structures 164 may be formed in the fin 124 by performing known manufacturing techniques. The isolation structures 164 may comprise any suitable insulating material, e.g., silicon dioxide. Several ion implantation processes may be performed to form a PW region 112 and a P⁻ doped region 166 in the N doped region 114 of the semiconductor substrate 110. As will be described in greater detail below, the P⁻ doped intrinsic base region 116 may be formed in the P⁻ doped region 166. In general, the dopant concentrations of the N-type dopant in the N doped region 114 and the P-type dopants in the PW region 112 and P⁻ doped region 166 may vary depending upon the particular application. In addition, any suitable species of N-type and P-type dopants may be used to dope the N doped region 114, PW region 112, and P⁻ doped region 166.

A process for forming a lateral BJT device 100 according to a further embodiment will now be described.

Figure 25:
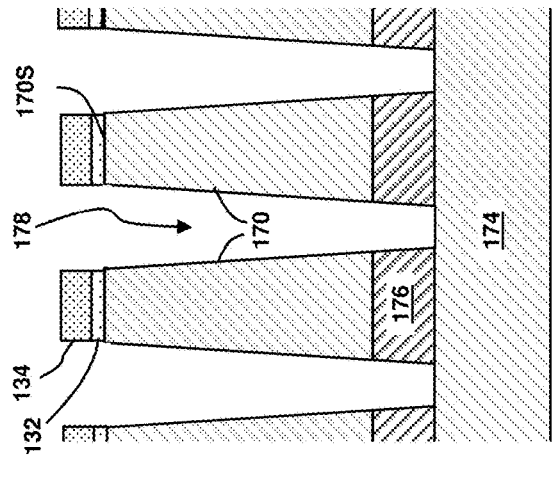
Figure 24:
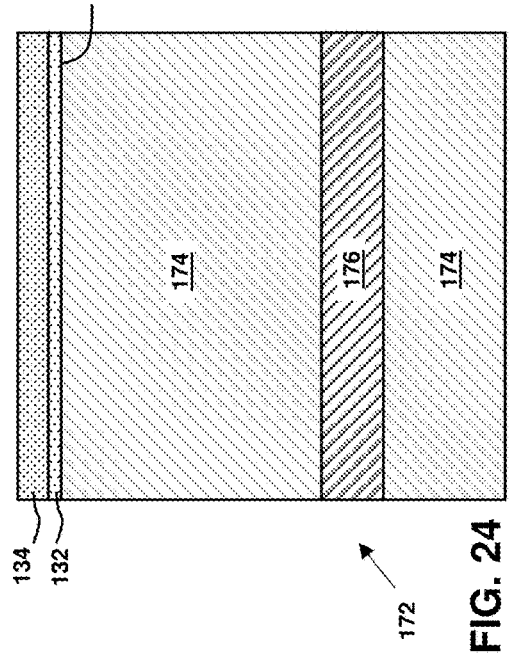
Figure 26:
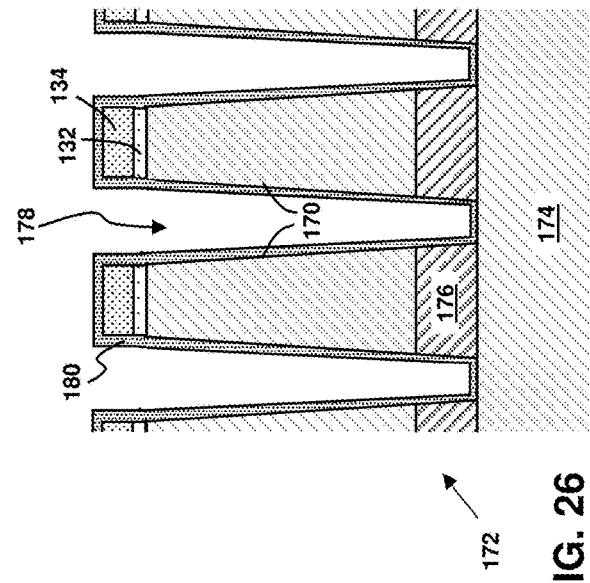

FIGS. 24-26 depict the formation of a plurality of fins 170 in a semiconductor substrate 172, where the semiconductor substrate 172 includes an N doped region 174 of a first semiconductor material (e.g., silicon) and a layer 176 of a second semiconductor material (e.g., silicon germanium (SiGe)) buried in the N doped region 174. As shown in FIG. 24, an oxide layer 132 (e.g., silicon dioxide) and a nitride layer 134 (e.g., silicon nitride) may be formed on an upper surface 174S of the N doped region 174 of the semiconductor substrate 172.

FIG. 25 depicts the structure of FIG. 24 after one or more etching processes have been performed, e.g., anisotropic etching processes, through a patterned fin-formation etch mask (not shown) to form a plurality of trenches 178 in the N doped region 174 and the buried semiconductor layer 176 of the semiconductor substrate 172, thereby defining the fins 170. As depicted in FIG. 26, a conformal layer of insulating material 180 (e.g., silicon dioxide) may be formed on the structure of FIG. 25 and within the trenches 178. Then, as depicted in FIG. 27, one or more masking/lithography and oxide etching processes may be performed on the structure depicted in FIG. 26 to selectively remove the conformal layer of insulating material 180 formed on the buried semiconductor layer 176 in the trenches 178.

Figure 27:
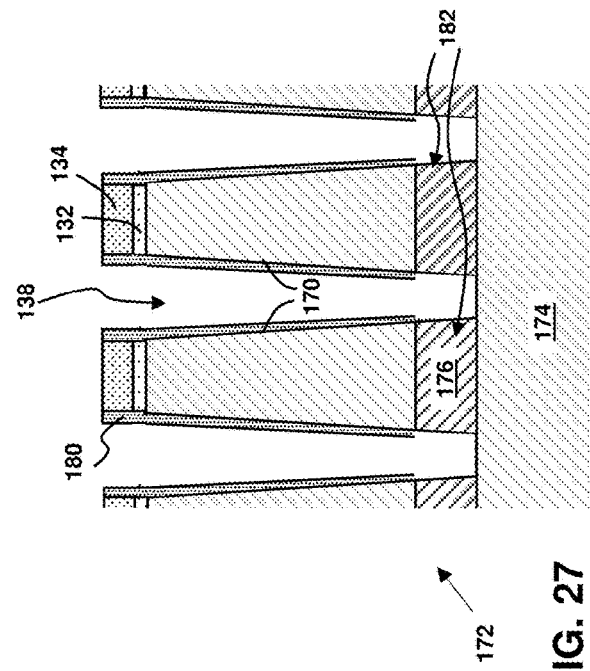
Figure 28:
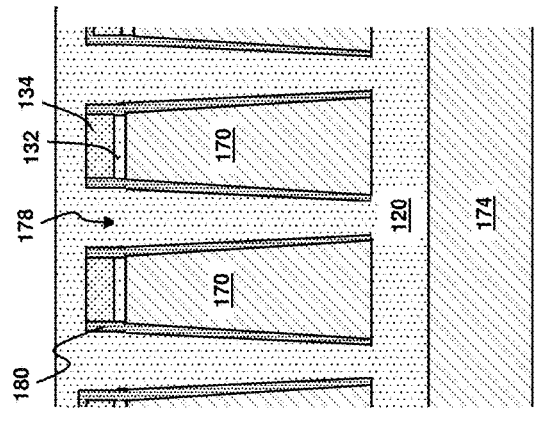
Figure 29:
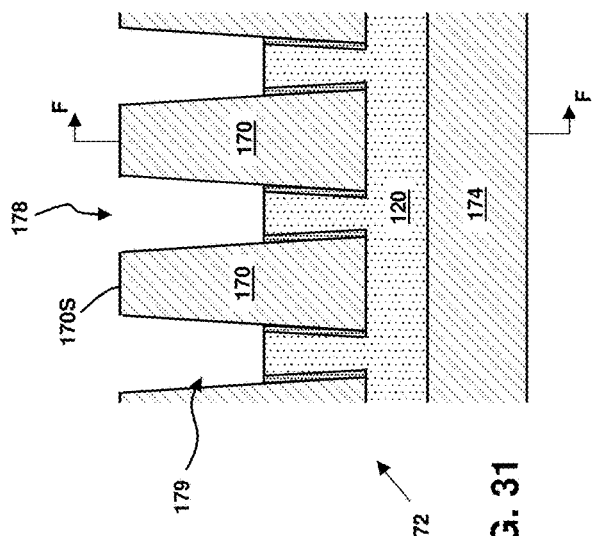

Referring now to FIG. 28, one or more etching processes may then be performed on the structure of FIG. 27. The etching processes is configured to selectively remove the buried semiconductor layer 176 at the bottom portion 182 (FIG. 27) of each of the fins 170 to form cavities 184. Then, as depicted in FIG. 29, the trenches 178 and cavities 184 of the structure in FIG. 18 may be filled with an insulating material 120, e.g., silicon dioxide. This may be achieved, for example, using flowable chemical vapor deposition (FCVD) and/or other processing techniques.

Figure 30:
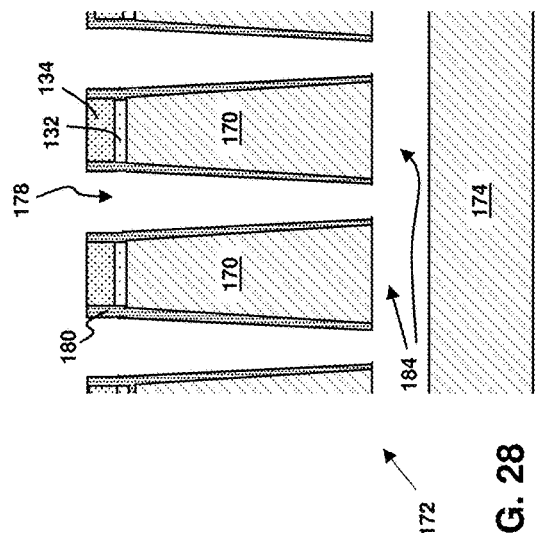
Figure 31:
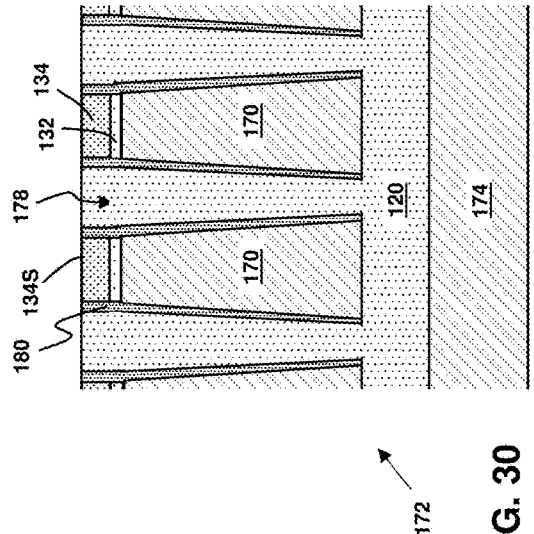

FIG. 30 depicts the structure of FIG. 29 after several additional processing steps have been performed. Such processing steps may include, for example, a CMP process for removing a portion of the insulating material 120 down to the top surface 134S of the nitride layer 134. Thereafter, as depicted in FIG. 31, a portion of the insulating material 120 may be removed in a fin reveal process (e.g., via chemical oxide etch (COE), plasma etch (e.g., RLSA), or other suitable process(es)) down to a top surface 170S of the fins 170 and from a top portion 179 of the trenches 178. As further depicted in FIG. 31, one or more etching processes may then be performed to remove the nitride layer 134, the oxide layer 132, and the conformal layer of insulating material 180 from the top portion 179 of the trenches 178.

Figure 32:
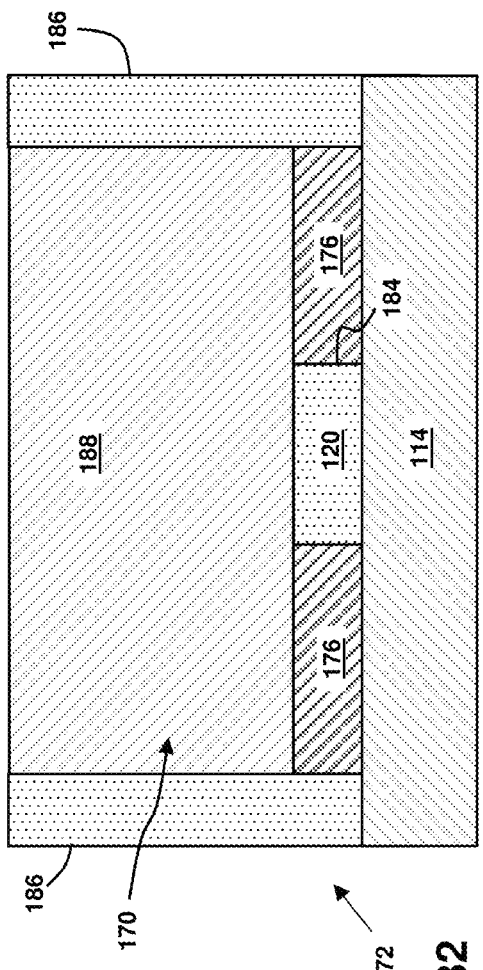

FIG. 32 depicts a cross-sectional view of the structure depicted in FIG. 31 taken along line F-F after several additional processes have been performed. For example, isolation structures 186 may be formed in the fin 170 using known manufacturing techniques. The isolation structures 186 may be comprised of any insulating material, e.g., silicon dioxide. Several ion implantation process may then be performed to dope the buried semiconductor layer 176 with a P⁺ dopant and to form a P⁻ doped region 188 in the N doped region 114 of the semiconductor substrate 110. As will be described in greater detail below, the P⁻ doped intrinsic base region 116 (FIG. 1) may be formed in the P⁻ doped region 188.

Referring now to FIGS. 33-41, a summary of various illustrative processes that may be used to form a lateral BJT device 100 (FIG. 1) according to embodiments based on the structure depicted in FIG. 12 will now be described. Similar processes may be carried out to form a lateral BJT device 100 based on the structures depicted in FIGS. 24 and 32.

FIG. 33 depicts a structure 200 corresponding to FIG. 12 after several process operations have been performed. In one illustrative process flow, the base region 106 of the lateral BJT device 100 may be formed by making use of a sacrificial gate structure 202 that is formed above the P⁻ doped region 152. Also depicted in FIG. 33 are a gate cap 204 and sidewall spacers 206. Various process flows may be performed to form these structures. In one illustrative process flow, the material for the sacrificial gate structure 202 as well as the material for the gate cap 204 may be blanket deposited on the structure 200. Thereafter, one or more masking and etching processes may be performed on these deposited materials so as to form the sacrificial gate structure 202 with the gate cap 204 positioned there above. Next, the simplistically depicted sidewall spacers 206 may be formed adjacent to the substantially vertically oriented sidewalls of the sacrificial gate structure 202. In one example, the sidewall spacers 206 may be formed by performing a conformal deposition process to form a conformal layer of sidewall spacer material on the sacrificial gate structure 202. At that point, an anisotropic etching process may be performed to remove horizontally oriented portions of the layer of spacer material, thereby forming the sidewall spacers 206 positioned on or adjacent the substantially vertically oriented sidewalls of the sacrificial gate structure 202. In terms of materials, the sacrificial gate structure 202 may comprise a sacrificial gate insulation layer (not separately shown), such as silicon dioxide, that is formed on the fin 124 and a sacrificial gate electrode (not separately shown) made of, for example, polysilicon or amorphous silicon, that is formed on the sacrificial gate insulation layer. The gate cap 204 may be comprised of a material such as silicon nitride, and the sidewall spacers 206 may be comprised of a low-k insulating material (e.g., k value less than about 3.4).

Still referencing FIG. 33, after formation of the sidewall spacers 206, a lightly doped drain (LDD) ion implantation process may be performed to form N⁺ LDD implant regions 208 within the P⁻ doped region 152. The dopant concentration of N-type dopant material in the N⁺ LDD implant regions 208 may vary depending upon the particular application. The N⁺ LDD implant regions 208 may be doped with any species of N-type dopant material.

Figure 35:
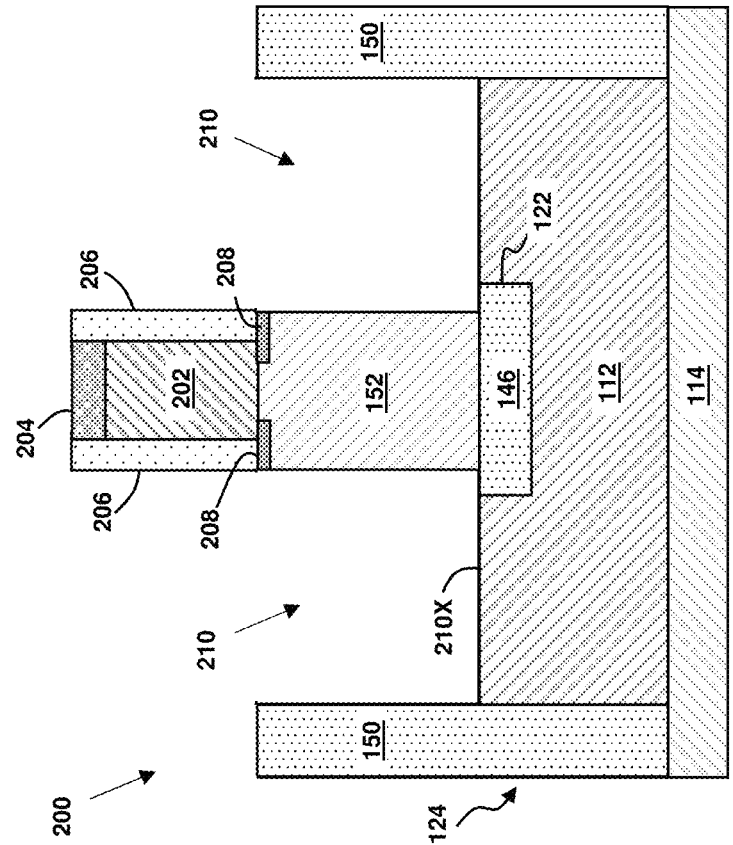

As will be described more fully below, referring now to FIG. 34, various process operations may be performed to form epitaxial cavities 210 in the fin 124 on opposite sides of the gate structure 202 where the emitter region 102 (FIG. 1) and the collector region 104 (FIG. 1) of the lateral BJT device 100 (FIG. 1) will be formed. Each of the epitaxial cavities 210 may have the same basic configuration. Accordingly, one or more etching processes, e.g., an anisotropic etching process, may be performed on the structure 200 of FIG. 33 to form a plurality of epitaxial cavities 210 in the fin 124 as shown in FIG. 34. The epitaxial cavities 210 may extend through the P⁻ doped region 152 and may have a bottom surface 210X that extends to or partially into the N doped region 114. The depth of the epitaxial cavities 210 may vary depending upon the particular application. In the presently disclosed example, the epitaxial cavities 210 are substantially vertically oriented and substantially self-aligned with respect to the sidewall spacers 206 and the isolation structures 150. In some cases, as shown in FIG. 35, the epitaxial cavities 210 may partially overlap the STI cavity 122.

Figure 36:
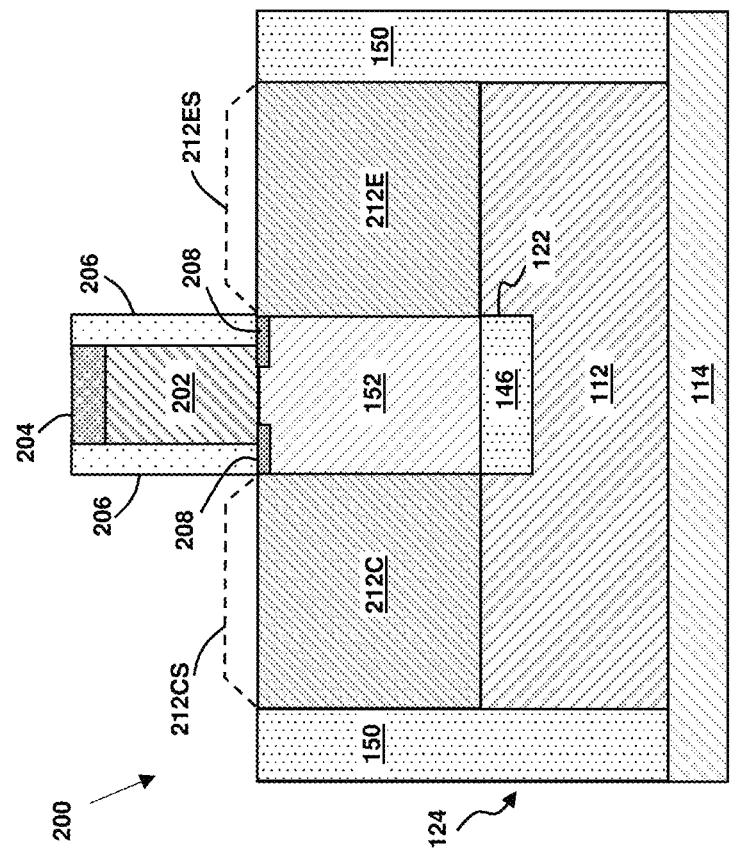

As depicted in FIG. 36, an epitaxial growth process may be performed on the structure 200 of FIG. 34 (or FIG. 35) to form a region of N$^+$ doped epi semiconductor material 212E (hereafter emitter region 212E) and a region of N$^+$ doped epi semiconductor material 212C (hereafter collector region 212C) in the epitaxial cavities 210. In one illustrative process flow, the emitter region 212E and collector region 212C may be doped in situ, i.e., dopant materials may be added during the epitaxial growth process. In other applications, the emitter region 212E and the collector region 212C may initially be formed as substantially undoped epi semiconductor material and thereafter, an ion implantation process may be performed to introduce the dopant material into the previously undoped emitter region 212E and collector region 212C. The emitter region 212E and the collector region 212C may be doped with any species of N-type dopant material, and may be include any desired semiconductor material, e.g., N doped silicon carbide. In some cases, the epi semiconductor material of the emitter region 212E and the collector region 212C may be grown in such a manner that the emitter region 212E and the collector region 212C have upper surfaces 212ES, 212CS, respectively, (depicted in dashed lines in FIG. 36) that is positioned above the upper surface 148S of the upper portion 148 of the fin 124 (FIGS. 11 and 12), i.e., raised source/drain regions.

FIG. 37 depicts the structure 200 of FIG. 36 after several process operations were performed. First, a layer of an insulating material 214, e.g., silicon dioxide, a low-k material, etc., may be formed adjacent the sidewall spacers 206 and planarized to the top surface 204S of the gate cap 204. A conformal etch stop layer (not shown) may be formed prior to forming the layer of insulating material 214. Then, as depicted in FIG. 38, one or more processing steps (e.g., etching) may be performed on the structure 200 of FIG. 37 to remove the sacrificial gate structure 202, thereby forming a base region cavity 216 that exposes the base region 106.

With further reference to FIG. 38, an epitaxial growth process may be performed after formation of the base region cavity 216 to form a region of P$^+$ doped epi semiconductor material 153 in the base region cavity 216 and on the P$^-$ doped region 152. This additional epi semiconductor material 153 forms the P$^+$ doped extrinsic base region 118 (FIG. 1) of the lateral BJT device 100. In one illustrative process flow, the epi semiconductor material 153 may be doped in situ, i.e., dopant materials may be added during the epitaxial growth process. In other applications, the epi semiconductor material 153 may initially be formed as substantially undoped epi semiconductor material and thereafter, an implantation process may be performed to introduce the dopant material into the previously undoped epi semiconductor material 153. Irrespective of how the P-type dopant material is introduced into the epi semiconductor material 153, the dopant concentration of P-type dopant material in the P$^+$ doped epi semiconductor material 153 may vary depending upon the particular application. The P$^+$ doped epi semiconductor material 153 may be doped with any species of P-type dopant material. The epi semiconductor material 153 may be made of any desired semiconductor material, e.g. P-doped silicon germanium for an NPN device, etc. The volume of the epi semiconductor material 153 that is formed may also vary depending upon the particular application.

FIG. 39 depicts the structure 200 of FIG. 38 after several additional process operations were performed. For example, another layer of an insulating material 218, e.g., silicon dioxide, a low-k material, etc., may be formed over the P$^+$ doped epi semiconductor material 153 in the base region cavity 216 and then planarized. As before, a conformal etch stop layer (not shown) may be formed in the base region cavity 216 prior to the formation of the layer of insulating material 218.

FIG. 40 depicts the structure 200 of FIG. 39 after one or more etching processes were performed on the layers of insulating material 214 and 218. For example, an etching process may be performed to form contact openings 220E, 220C, and 220B (collectively referenced using the numeral 220) that expose the emitter region 212E, the collector region 212C, and the P$^+$ doped epi semiconductor material 153 of base region 106, respectively. A portion of the insulating material 214 may remain after the etching, forming sidewall spacers 222.

Figure 41:
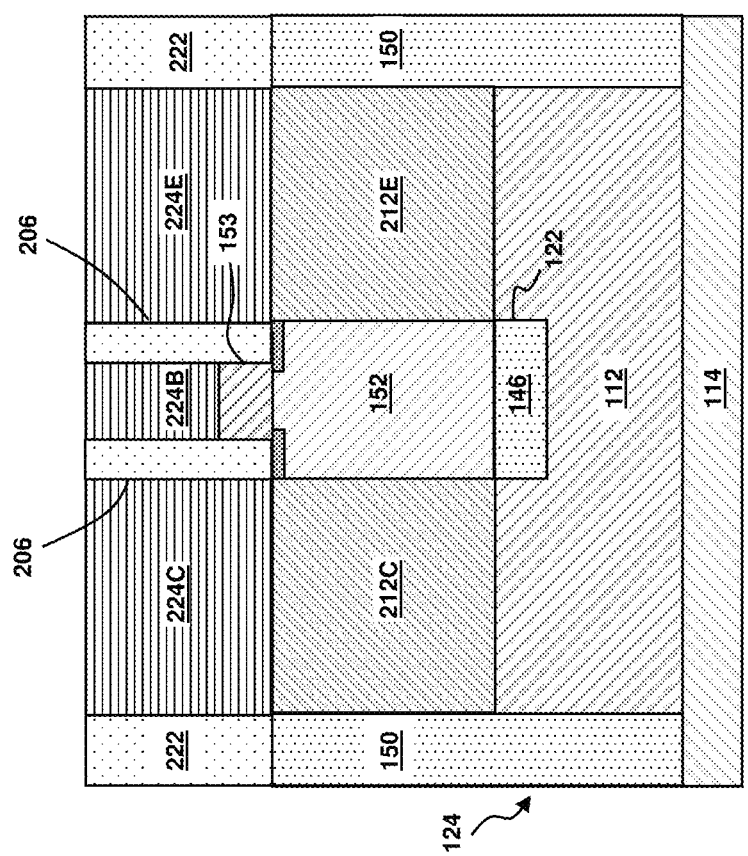

As depicted in FIG. 41, conductive contact structures 224E, 224C, and 224B (collectively referenced using the numeral 224) may be formed in a conventional manner in the contact openings 220 to conductively contact the emitter region 212E, the collector regions 212C, and the P$^+$ doped epi semiconductor material 153 of base region 106, respectively. For example, the conductive contact structures 224E, 224C, and 224B may be formed at the same time that conductive source/drain metallization structures (not shown) are formed for contacting the source/drain regions of transistor devices (not shown) formed elsewhere on the structure 200 and they may be made of the same materials as the conductive source/drain metallization structures, e.g., a trench silicide material.

As described above with regard to FIGS. 33-41, various illustrative processes may be used to form a lateral BJT device 100 (FIG. 1) according to embodiments based on the structure depicted in FIG. 12. Similar processes may also be performed to form a lateral BJT device 100 according to embodiments based on the structures depicted in FIGS. 23 and 32.

As will be appreciated by those skilled in the art after a complete reading of the present application, the novel configuration of the lateral BJT device 100 disclosed herein provides significant benefits as compared to prior art lateral BJT devices. For example, a lateral BJT device 100 with an STI cavity 122 separating the intrinsic base region 116 from the underlying substrate drastically deceases the base to bulk substrate leakage current in the lateral BJT device 100 as compared to prior art lateral BJT devices.

Figure 42:
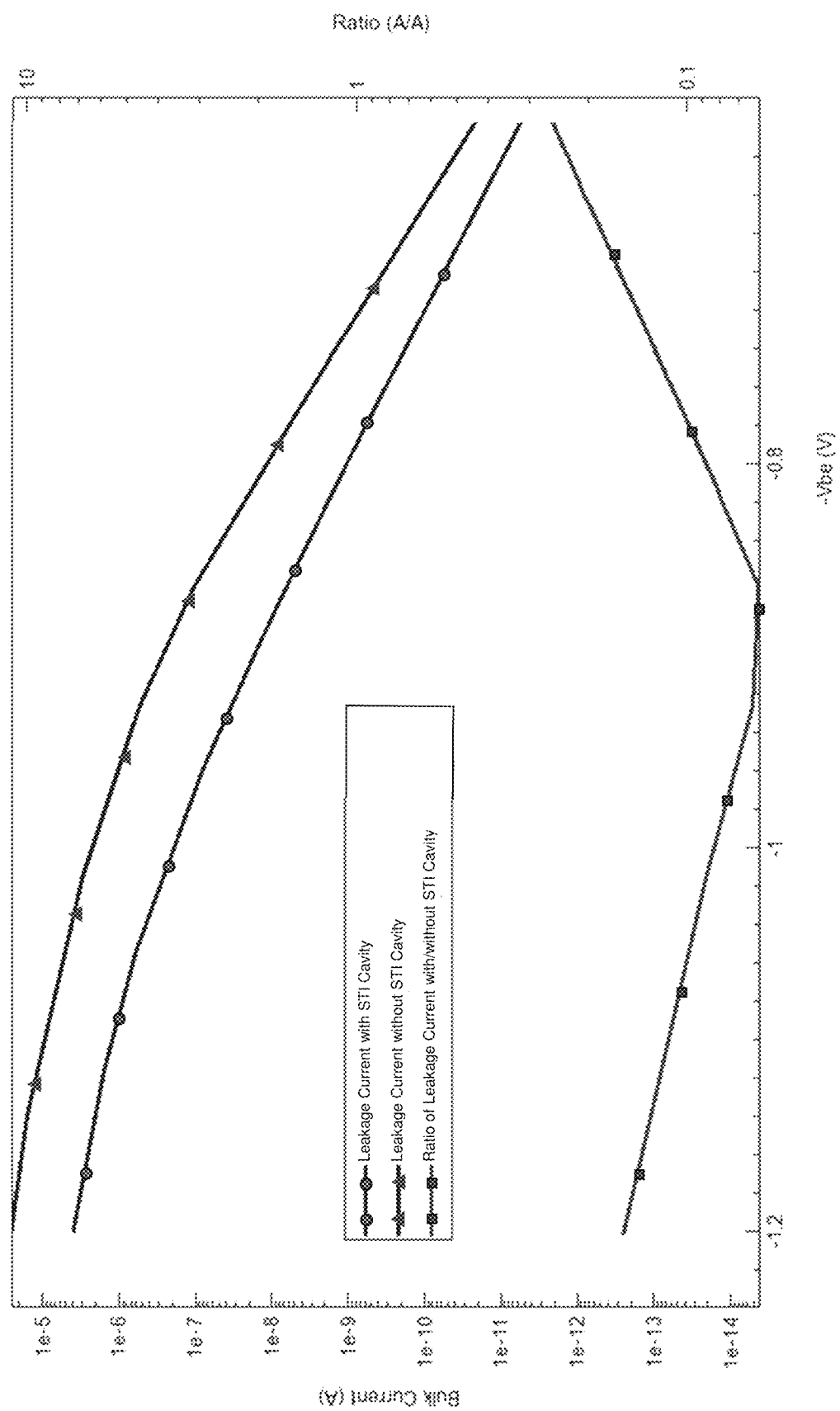
FIGS. 42 and 43 are graphs illustrating operational characteristics of a lateral BJT device according to embodiments of the disclosure.

FIG. 42 is a graph of the base to bulk substrate leakage current for a lateral BJT device 100 with an STI cavity below the intrinsic base region according to embodiments compared to the leakage current of a lateral BJT device formed on a bulk semiconductor that does not include an STI cavity below the intrinsic base region. As shown on the Y2 axis (right hand side) of the graph depicted in FIG. 42, the leakage current in a lateral BJT device 100 with an STI cavity below the intrinsic base region according to embodiments may be approximately ten times (10×) less than that of a lateral BJT device formed on a bulk semiconductor.

Figure 43:
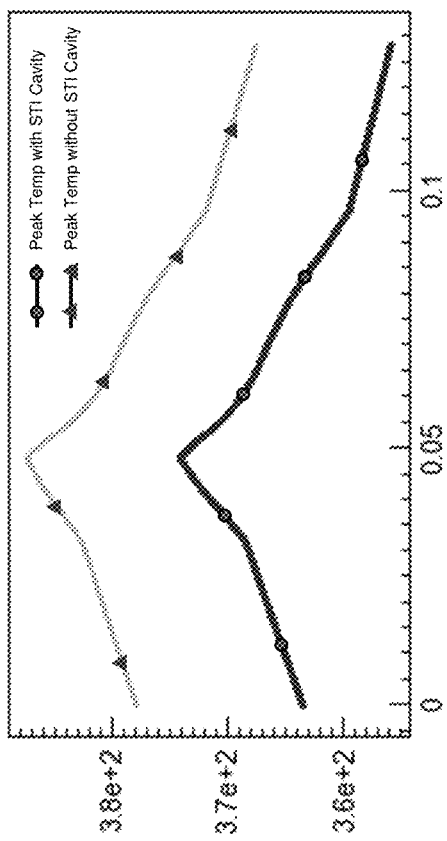

FIG. 43 is a graph of the peak operational temperature of a lateral BJT device 100 with an STI cavity below the intrinsic base region according to embodiments compared to the peak operational temperature of a lateral BJT device built on a silicon-on-insulator (SOI) substrate (i.e., oxide under emitter, collector, and base). As can be seen in the graph depicted in FIG. 43, a lateral BJT device 100 with an STI cavity below the intrinsic base region according to embodiments operates at a lower peak temperature than that of a lateral BJT device built on a silicon-on-insulator (SOI) substrate (i.e., oxide under emitter, collector, and base).

Figure 44:
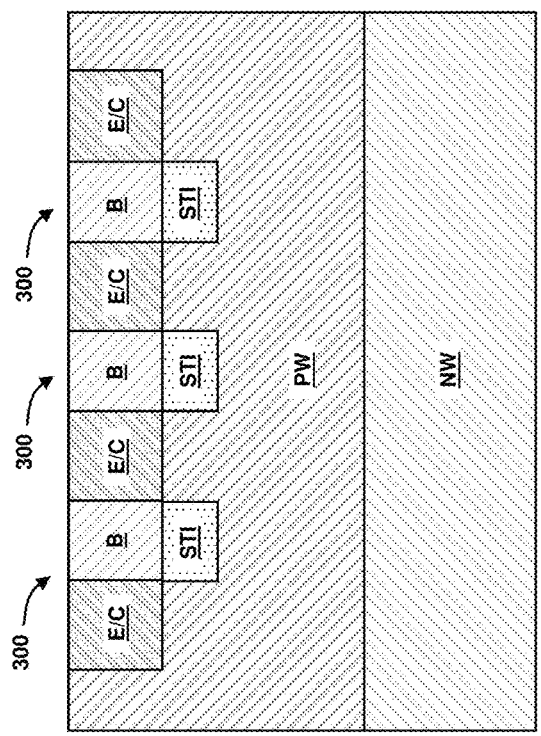
FIG. 44 depicts a structure including a plurality of lateral BJT devices according to embodiments of the disclosure.

In addition to providing a significantly lower leakage current and improved thermal dissipation, a lateral BJT device 100 with an STI cavity below the intrinsic base region according to embodiments may operate at speeds similar to that of a lateral BJT device built on an SOI substrate. Further, a lateral BJT device 100 with an STI cavity below the intrinsic base region according to embodiments provides electrical isolation between the lateral BJT device 100 and other devices sharing the same well, which significantly reduces parasitics. For example, FIG. 44 depicts a structure including a plurality of lateral BJT devices 300 in a shared well (e.g., a P-well (PW) in this example) according to embodiments of the disclosure. Adjacent lateral BJT devices 300 may share an emitter region E or a collector region C with adjacent lateral BJT devices 300. Each lateral BJT device 300 further includes a base region B and an STI cavity formed in the shared well below the base region B. Advantageously, the STI cavity in each lateral BJT device 300 electrically isolates the base regions B of the lateral BJT devices 300 from one another, preventing current flow between the base regions B via the shared well.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A device, comprising:
   an emitter region, a collector region, and a base region, the base region positioned between and laterally separating the emitter region and the collector region, the base region including an intrinsic base region; and
   a cavity formed in a semiconductor substrate and filled with an insulating material, the cavity physically separating a lower surface of the intrinsic base region from the semiconductor substrate,
   wherein the emitter region and the collector region are physically separated from the cavity by the semiconductor substrate.

2. The device of claim 1, further comprising an extrinsic base region formed over the intrinsic base region.

3. The device of claim 1, wherein a bottom surface of the emitter region and a bottom surface of the collector region are positioned on an upper surface of the semiconductor substrate.

4. The device of claim 1, wherein the cavity is positioned only under the intrinsic base region.

5. The device of claim 1, wherein the intrinsic base region physically contacts the cavity.

6. The device of claim 1, wherein the emitter region, the collector region, the base region, and the cavity are formed in a fin structure.

7. The device of claim 6, wherein the cavity physically separates a first portion of the fin structure from a second portion of the fin structure.

8. A lateral bipolar junction transistor (BJT) device, comprising:
   an emitter region, a collector region, and a base region, the base region positioned between and laterally separating the emitter region and the collector region, the base region including an intrinsic base region; and
   a cavity formed in a semiconductor substrate and filled with an insulating material, the cavity physically separating a lower surface of the intrinsic base region from the semiconductor substrate,
   wherein the intrinsic base region physically contacts the cavity, wherein a bottom surface of the emitter region and a bottom surface of the collector region are positioned on an upper surface of the semiconductor substrate, and wherein the emitter region and the collector region are physically separated from the cavity by the semiconductor substrate.

9. The lateral BJT device of claim 8, further comprising an extrinsic base region formed over the intrinsic base region.

10. The lateral BJT device of claim 8, wherein the cavity is positioned only under the intrinsic base region.

11. The lateral BJT device of claim 8, wherein the emitter region, the collector region, the base region, and the cavity are in a fin structure.

12. The lateral BJT device of claim 11, wherein the cavity physically separates an upper portion of the fin structure from a lower portion of the fin structure.

13. The lateral BJT structure of claim 8, wherein the semiconductor substrate comprises a first semiconductor material, the lateral BJT device further comprising:
    a layer of a second semiconductor material buried in the semiconductor substrate; and
    an opening formed in the layer of the second semiconductor material,
    wherein the opening in the layer of the second semiconductor material comprises the cavity, and wherein the opening is filled with the insulating material.

14. The lateral BJT structure of claim 13, wherein a first portion of the layer of the second semiconductor material is separated from a second portion of the layer of the second semiconductor by the opening.

15. A method for forming a lateral bipolar junction transistor (BJT) device, comprising:
    forming a cavity in a semiconductor substrate;
    filling the cavity with an insulating material; and
    forming an emitter region, a collector region, and a base region in the semiconductor substrate, the base region positioned between and laterally separating the emitter region and the collector region, the forming further comprising forming the base region over and in physical contact with the cavity, wherein the base region is physically separated from the semiconductor substrate by the cavity, and wherein the cavity physically separates an upper portion of the fin structure from a lower portion of the fin structure.

16. The method of claim 15, wherein the semiconductor substrate includes a fin structure.

\* \* \* \* \*